United States Patent [19]

Engdahl et al.

[11] Patent Number: 5,070,316

[45] Date of Patent: Dec. 3, 1991

[54] DEVICE FOR TRANSMISSION OF THE MOVEMENT AND FORCE OF A HIGH-MAGNETOSTRICTIVE BODY

[75] Inventors: Göran Engdahl, Täby; Dag Wikström, Västerås, both of Sweden

[73] Assignee: ABB Atom AB, Västerås, Sweden

[21] Appl. No.: 604,016

[22] Filed: Oct. 26, 1990

[30] Foreign Application Priority Data

Oct. 31, 1989 [SE] Sweden .............................. 8903632-1

[51] Int. Cl.⁵ .......................... H01F 7/00; H01F 7/02; H01F 7/06
[52] U.S. Cl. ....................................... 335/215; 310/26
[58] Field of Search ....................... 335/215, 296, 302; 310/26

[56] References Cited

U.S. PATENT DOCUMENTS 4,914,412  4/1990  Engdahl .............................. 335/215

Primary Examiner—Leo P. Picard
Assistant Examiner—Ramon M. Barrera
Attorney, Agent, or Firm—Watson, Cole, Grindle & Watson

[57] ABSTRACT

The invention relates to a special embodiment of a plate which is to be able to transmit movement and compressive force as well as possess soft-magnetic properties with low losses and low reluctance. The latter requirement means, inter alia, that the plate, upon loading, will be subjected to a relatively great elastic deformation with an ensuing reduced ability to transmit movement and compressive force. By perforating the plate with a number of evenly distributed holes provided with pellets of a stiff resistant material with an axial length at least as great as the thickness of the plate, movement and compressive force may be transmitted from a compressive force-generating element via the plate to a compressive force-absorbing element without the plate being elastically deformed.

6 Claims, 1 Drawing Sheet

DEVICE FOR TRANSMISSION OF THE MOVEMENT AND FORCE OF A HIGH-MAGNETOSTRICTIVE BODY

TECHNICAL FIELD

Certain parts of a device may be subjected to high stresses of various kinds, depending on the purpose of the design. The possibilities available for ensuring that the stresses do not jeopardize the function of the device depend on several factors such as, for example, the material in question, the nature and frequency of the stress, the environment, etc. A device according to the invention is intended to be used when a compressive stress directed against a plate may become of such a magnitude that the function of the device may be jeopardized or considerably deteriorated.

BACKGROUND ART

U.S. Pat. No. 4,914,412 relates to a specially designed magnetic circuit which, inter alia, comprises driving elements of a material with high-magnetostrictive properties, for example Terfenol. The magnetic material which is to be magnetized consists of a cylindrical body. It is surrounded by a magnetizing coil which has the same axial length as the cylindrical body. The two plane surfaces of a circle which are formed by the end surfaces of the body and the end surfaces of the coil are covered by relatively thin circular plates having the same outside diameters as the coil and are manufactured from a soft-magnetic material.

The magnetic circuit is magnetized statically by means of permanent magnets which are formed as discs having the same diameter as that of the soft-magnetic plates are arranged on top of these. The magnetic circuit finally comprises a cylindrical ring of ferromagnetic material having the same axial length as the coil and surrounding the coil.

Since as mentioned above the cylindrical body is made of high-magnetostrictive material, i.e. with a great linear expansion, the compressive stresses on the circular plates may become considerable. Since otherwise the magnetic circuit has a high dynamic performance, also fatigue problems may arise in connection with a high mechanical load.

From a magnetic point of view, it is important that the circular plates have as low reluctance as possible and that the eddy current and hysteresis losses are also as low as possible. One suitable material from these points of view is therefore, for example, a pressed powder mixture of soft-magnetic particles and plastic particles. It is then obvious that the mechanical loadability becomes restricted. If the material is subjected, for example, to a high compressive stress within the elastic range, this will result in a considerable elastic deformation, i.e. the compressive stress from the cylindrical body will be capable of being transmitted only to an insignificant extent to an external mechanical load. If the compressive stress results in a load on the material which exceeds the elastic range, the material will be pulverized. From a mechanical point of view, therefore, such a material is less suitable.

DISCLOSURE OF THE INVENTION

The invention comprises a special embodiment of the circular plates which permits movement and compressive stresses both of a static and of a dynamic nature, which arise in connection with changes of length of the cylindrical body, to be transmitted to the external mechanical load without the circular plates being compressed. This can be done by perforating the circular plates with a number of evenly distributed, preferably circular-cylindrical holes in that part of the plates which corresponds to the end surface of the cylindrical body. In these holes are placed pellets of a resistant material with a high modulus of elasticity. To obtain low magnetic losses, the pellets should preferably be made of a ceramic material. The pellets are dimensioned radially so as to be easily movable in an axial direction. In the axial direction the pellets shall be dimensioned so as to have a length which at least corresponds to the thickness of the circular plates in unloaded state.

The perforation increases the reluctance of the circular plates. To prevent too large an increase, it is desirable for the fill factor—i.e. how large a portion of the available surface that is covered by the perforated holes—not to become too great.

From a magnetic point of view, it is desirable to have a large number of small holes. However, this also requires an equally large number of pellets with small cross section areas. However, from the points of view of manufacturing, assembly and cost, this is a disadvantage.

To cause the different pellets to transmit an equally great part of the movement and compressive force from the circular-cylindrical body to the permanent magnets, it is required that the pellets have an exactly equally great axial length. A difference between the pellets in this respect means that both the circular-cylindrical body and the permanet-magnetic discs partially may be subjected to relatively high stresses. To obtain a more even pressure distribution across the end surfaces of the cylindrical body, there is also introduced a pressure-equalizing plate of a ceramic material with the same diameter as that of the cylindrical body between the end surfaces of the body and the two circular plates.

DESCRIPTION OF THE PREFERRED EMBODIMENT

Figure 1:
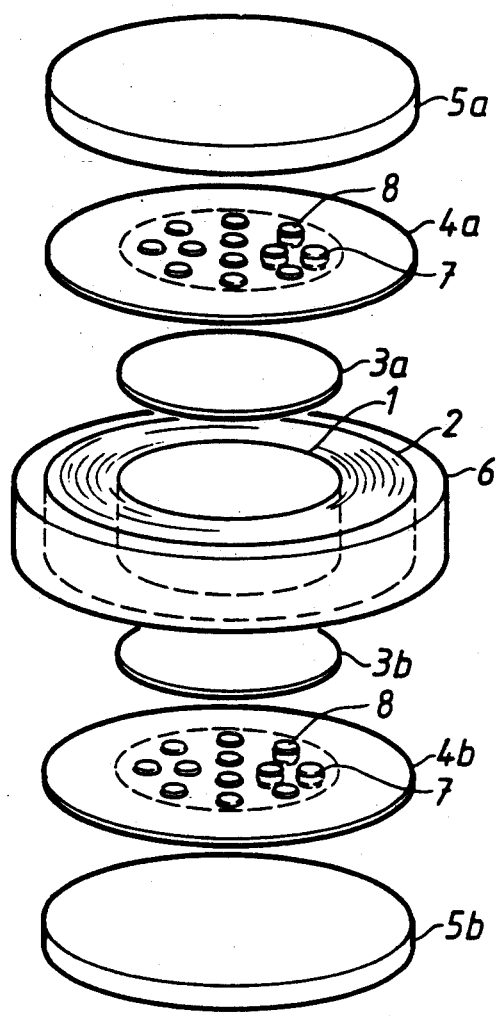

The accompanying FIGURE shows a magnetic circuit according to that described in U.S. Pat. No. 4,914,412, the parts included being axially displaced relative to each other to provide a clearer illustration. The cylindrical body of high-magnetostrictive material is shown at 1. The surrounding coil for magnetization is shown at 2. As will be clear from the description, pressure-equalizing plates 3a and 3b have been inserted at the end surfaces of the cylindrical body. The plane circular plates which cover the cylindrical body with the pressure-equalizing discs and the surrounding coil are shown at 4a and 4b. The external force-absorbing permanent-magnetic discs are shown at 5a and 5b and, finally, the surrounding ferromagnetic ring is shown at 6.

As will have been clear, the invention comprises a modification of the circular plates 4a and 4b to prevent elastic deformation thereof and hence a deteriorated transmission of movement and compressive force between the cylindrical body 1 and the permanent-magnetic discs 5a and 5b. The modification comprises the provision of a number of evenly distributed holes 7 in the central part of the thin circular plates which corresponds to the end surfaces of the cylindrical body. A suitable fill factor according to a previous definition lies within the range of 0.1 to 0.7. The holes preferably have a circular-cylindrical shape although other shapes of the holes are possible to use. For reasons described above, a suitable ratio of the diameter of the holes to the diameter of the cylindrical body may be between 0.05 and 0.5.

In the holes of the plates, the pellets 8 of a resistant, preferably ceramic material, are placed. The radial fit between the cylindrical surface of the holes and the cylindrical surface of the pellets shall be such as to allow easy movability between these surfaces. Finally, as mentioned, the axial length of the pellets shall be at least as great as the thickness of the circular plates in unloaded state.

We claim:

1. A device for transmission of movement and compressive force between a cylindrical body of a high-magnetostrictive material and attached force absorbing elements, said body due to magnetostrictive change in the axial length thereof acting as a force-generating element, said force absorbing elements being in the form of discs and making contact with said body, said device comprising circular thin plates which for magnetic reasons consist of a low-loss magnetic material, said thin plates being located between the cylindrical body and the force-absorbing elements, said plates each having a portion which corresponds to a respective end surface of the cylindrical body, a plurality of evenly distributed holes being provided in each said portion, and easily movable pellets of a stiff and resistant material being positioned in said holes.

2. A device for transmission of movement and compressive force according to claim 1, where, between the respective end surfaces of the cylindrical body and the thin circular plates, there are provided pressure-equalizing plates of a ceramic material with the same diameter as the respective end surface of the cylindrical body.

3. A device for transmission of movement and compressive force according to claim 1, where the axial length of the pellets is at least as great as the thickness of the plates in unloaded state.

4. A device for transmission of movement and compressive force according to claim 1, where the ratio of the total area of the provided holes to the respective end surface of the cylindrical body is within the range of 0.1 to 0.7.

5. A device for transmission of movement and compressive force according to claim 1, where the holes have a cylindrical shape.

6. A device for transmission of movement and compressive force according to claim 1, where the ratio of the diameter of the holes to the diameter of the cylindrical body lies within the range of 0.05 to 0.5.

* * * * *